(12) United States Patent
Telle et al.

(10) Patent No.: US 8,743,919 B2
(45) Date of Patent: Jun. 3, 2014

(54) METHOD FOR GENERATING COHERENT-PHASE LIGHT FIELDS HAVING A PREDEFINABLE VALUE OF THE FREQUENCY THEREOF, AND OPTICAL FREQUENCY SYNTHESIZER

(75) Inventors: Harald Telle, Gifhorn (DE); Erik Benkler, Braunschweig (DE)

(73) Assignee: Bundesrepublik Deutschland, vertreten durch das Bundesministerium fuer Wirtschaft und Technologie, dieses vertreten durch den Praesidenten der Physikalisch-Technischen Bundesantalt, Braunschweig (DE)

( * ) Notice: Subject to any disclaimer, the term of this patent is extended or adjusted under 35 U.S.C. 154(b) by 39 days.

(21) Appl. No.: 13/701,125

(22) PCT Filed: Jun. 1, 2011

(86) PCT No.: PCT/EP2011/002705
§ 371 (c)(1),
(2), (4) Date: Feb. 7, 2013

(87) PCT Pub. No.: WO2011/151062
PCT Pub. Date: Dec. 8, 2011

(65) Prior Publication Data
US 2014/0112360 A1 Apr. 24, 2014

(30) Foreign Application Priority Data
Jun. 3, 2010 (DE) .......................... 10 2010 022 585

(51) Int. Cl.
*H01S 3/10* (2006.01)
(52) U.S. Cl.
USPC ..................... 372/28; 372/26; 372/23; 372/20

(58) Field of Classification Search
USPC ........................................ 372/28, 26, 23, 20
See application file for complete search history.

(56) References Cited

U.S. PATENT DOCUMENTS 5,835,199 A * 11/1998 Phillips et al. ................ 356/5.03
5,963,567 A * 10/1999 Veselka et al. .................. 372/21
(Continued)

FOREIGN PATENT DOCUMENTS

JP      2002-076507     3/2002
WO    WO 02/99939     12/2002

OTHER PUBLICATIONS

H.R. Telle, B. Lipphardt, J. Stenger, "Kerr-lens, mode-locked lasers as transfer oscillators for optical frequency measurements," Appl. Phys. B 74, 1-6 (2002).

(Continued)

*Primary Examiner* — Kinam Park
(74) *Attorney, Agent, or Firm* — Collard & Roe, P.C.

(57) ABSTRACT

The invention relates to a method for generating coherent-phase light having a predefinable frequency value ($v_{Soll}$), comprising the steps of generating working light with a working frequency ($v_{SL}$), generating a frequency comb (10), which is a light field that consists of equidistant coherent-phase spectral lines, selecting a comb line (having the index m) from the frequency comb (10) having a frequency ($v_m$), generating a frequency shift ($\Delta v$) of the frequency comb (10) and/or the working frequency ($v_{SL}$) by means of time-dependent phase settings ($\phi_S(t)$) modulo a multiple of $2\pi$, in particular of $2\pi$, and phase-coupling the possibly frequency-shifted fields of the working light ($v_{SL}$) and the one possibly frequency-shifted frequency comb line ($v_m$), so that the frequencies thereof are rigidly phase-coupled via the frequency shift ($\Delta v$), and working light having the desired frequency ($v_{Soll}$) is obtained.

11 Claims, 7 Drawing Sheets

(56) References Cited

U.S. PATENT DOCUMENTS

Figure 1:
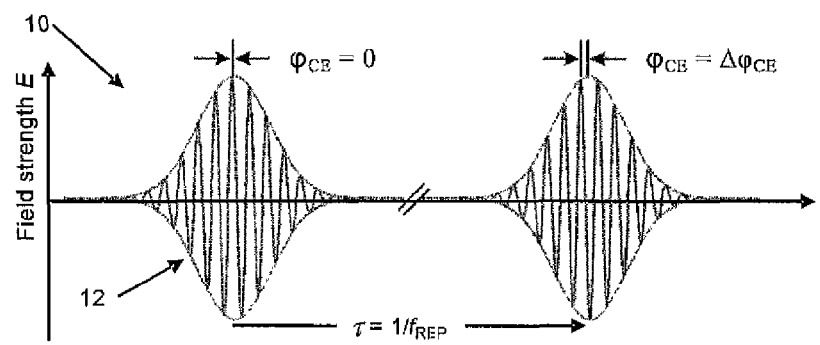

2003/0184760 A1* 10/2003 Bonnet .......................... 356/489
2004/0017833 A1* 1/2004 Cundiff et al. ................... 372/18
2005/0018724 A1* 1/2005 Da Silva et al. ................. 372/32

OTHER PUBLICATIONS

DIN EN 62424 and DIN IEC 60050-351, Nov. 2011.
International Search Report of PCT/EP2011/002705, Sep. 30, 2011.
Beverini, N. et al.: "Phase locking of a diode laser to a Ti:Sa comb by means of an analog+digital phase-frequency detector," Laser Optics 2003, Solid State Lasers and Nonlinear Frequency Conversion, Jun. 30-Jul. 4, 2003 St. Petersburg, Russia, vol. 5478, No. 1, 2004, pp. 195-203, XP009151752, Proceedings of the SPIE—The International Society for Optical Engineering SPIE—Int. Soc. Opt. Eng. USA ISSN: 0277-786X.
Nakagawa, K. et al., "Proposal of a Frequency-Synthesis Chain Between the Microwave and Optical Frequencies of the CA Intercombination Line at 657 NM Using Diode Lasers," Applied Physics B. Photophysics and Chemistry, Springer Verlag, Heidelberg, Germany, vol. B57, No. 6, Dec. 1, 1993, pp. 425-430, XP000423113.

* cited by examiner

METHOD FOR GENERATING COHERENT-PHASE LIGHT FIELDS HAVING A PREDEFINABLE VALUE OF THE FREQUENCY THEREOF, AND OPTICAL FREQUENCY SYNTHESIZER

CROSS REFERENCE TO RELATED APPLICATIONS

This application is the National Stage of PCT/EP2011/002705 filed on Jun. 1, 2011, which claims priority under 35 U.S.C. §119 of German Application No. 10 2010 022 585.1 filed on Jun. 3, 2010, the disclosures of which are incorporated by reference. The international application under PCT article 21(2) was not published in English.

The invention relates to a method for generating a coherent-phase light field having a predefinable value of the frequency thereof, and to a method for generating a coherent-phase light field of a frequency, the value of which varies to in the course of time according to a predefinable course. In accordance with a second aspect, the invention relates to an optical frequency synthesizer.

For various applications, e.g. in spectroscopy, it is advantageous being able to generate monochromatic coherent-phase light fields with a predefinable value of its frequency, wherein this frequency value should be known with high accuracy. This is already achievable for certain restricted frequency intervals, but up to now it has been impossible to build a broadband-tunable light source with a coherent-phase emission field in which the frequency value for each frequency within the tuning range is known with high accuracy.

It is the object of the present invention to provide coherent-phase light fields with a freely definable frequency, wherein the frequency value is adjustable with high accuracy and in principle traceable to the SI second.

The present invention solves this problem by a method for generating light of a predefinable frequency value $v_{Soll}$, comprising the steps of (a) generating working light with a working frequency $v_{SL}$, (b) generating a light field with a frequency comb-shaped spectrum which consists of equidistant coherent-phase individual lines, (c) selecting a comb line from the frequency comb (index m) with the frequency value $v_m$, (d) generating a frequency shift of the frequency comb and/or the working frequency by means of phase settings $\phi_S(t)$, whose maximal magnitude may be confined to the value $2\pi$.

In accordance with a second aspect, the invention solves the problem by means of an optical frequency synthesizer comprised of (i) a tunable working light source for emitting a working light with a working frequency, (ii) a light input for coupling-in a light field whose spectrum consists of equidistant coherent-phase individual lines, (iii) a frequency/phase control which is set up for generating a frequency shift of the frequency comb light and/or working light by variable to phase settings $\phi_S(t)$, and (iv) a phase control for controlling the frequency/phase of the possibly frequency-shifted working light to the frequency/phase of the field of a possibly frequency-shifted frequency comb line.

Phase setting $\phi_S(t)$ is understood to mean the phase difference between the Input and output of the phase actuator element. Temporal changes in the phase is settings within an inverse of the comb line distance are designated as phase setting progress $\Delta\phi_S$.

In accordance with a third aspect, the present invention solves the problem by means of an optical frequency synthesizer in which the frequency-shifted light field of the selected comb line is sol filtrated that only a monochromatic phase-traceable continuous wave field remains left. For example, this can be accomplished by means of an empty passive resonator or a passive resonator with internal frequency doubling.

The present invention bears the advantage in that in principle every frequency design value within the tuning range of the working light source can be predefined. The values of all frequencies are rigidly-phase traceable to an atomic clock and thus they are adjustable with high accuracy.

It is moreover advantageous that a quick and simultaneously precise tuning of a continuous wave (CW) laser is enabled by the aid of the present invention.

Within the scope of the present description, generating a working light with the working frequency is particularly understood to mean generating a coherent-phase monochromatic laser beam. For example, a tunable laser is utilized as working light source for this purpose. It is possible, for instance, to utilize an extended cavity laser diode. Diodes of this kind are of a comparably simple set-up and thus economically operable.

Working light may have a frequency in the visible spectral domain. It is also possible that the working light lies in the infra-red and/or ultra-violet range.

Frequency comb is understood to mean a light field corresponding to a multitude of equidistant spectral lines, wherein the oscillation phase of each individual line is traceable in terms of time. Such a frequency comb can be described as having been obtained by means of temporally periodical modulation of a carrier oscillation with a carrier frequency $v_C$ by a periodical complex-valued envelope with a repetition frequency $f_{REP}$. In many cases, this periodical complex-valued is envelope is an amplitude modulation in form of short pulses. Therefore, the term "pulse" as used in the following is used synonymously to the term "complex-valued envelope".

Frequency comb is usually designated as a light field with narrow-band equidistant emission lines which typically cover a spectral range from 10 nanometers to 100 nanometers. In principle, these frequency comb lines can be put in a solid frequency and/or phase relation to the emission fields of lasers whose frequency values coincide with those of atomic resonances. Generating a frequency comb is particularly understood to mean generating a self-referenced frequency comb in which the so-called carrier-envelope-offset frequency $v_{CEO}$ and phase $\phi_{CE}$ is known.

It is favorable if the frequencies of the frequency comb lines are frequency-stabilized to those of an atomic dock. For example, the repetition frequency which is a microwave frequency can be stabilized to a microwave atomic clock. In this manner, the distances of the individual frequencies in the frequency comb are known with particularly high accuracy. Alternatively or in addition thereto, the value of the carrier frequency may originate from a high-precision laser serving as frequency normal.

The feature that the field of the working light source and those of a selected comb line are phase-coupled is particularly understood to mean that a spectral shift of the entire frequency comb always leads to a corresponding shift of the working frequency.

A core idea of the present invention is that in case of a temporally periodically modulated carrier signal (frequency comb) only finite phase settings are required for arbitrarily large phase changes of the working light, if these are effected within the cycle of modulation at the repetition frequency. This becomes evident when decomposing the amount of the phase setting into two summands, thereof the first being equal to an integer multiple of $2\pi$ and the second being $\leq 2\pi$. Owing to periodicity, the first value can be replaced with the value 0 without this causing any change in the frequency shift. Hence it is sufficient utilizing only the is second summand, the divisor remainder obtained on dividing the "formally correct" phase value by $2\pi$ (usually designated as phase value 'modulo $2\pi$') for phase setting.

This also implies consequences for frequency shifts whose amount exactly corresponds to an integer multiple of the repetition frequency, i.e. wherein the frequency comb merges in itself (apart from the—here negligible—amplitude change which stems from the much less frequency-dependent spectral envelope of the frequency comb). Here, the phase progress $\Delta\phi_S$, that means the difference of consecutive phase settings, is equal to a multiple of $2\pi$ and can therefore be replaced with the value 0.

Physical Background

A frequency comb is established, for instance, by means of a mode-coupled laser, for example a Kerr lens mode-coupled titanium-doped sapphire laser. It emits a light field which in a time image can be described as obtained as a modulation of a carrier wave with a carrier frequency $v_c$ by a periodical complex-valued envelope $\hat{E}(t)$:

$$E(t) = \sum_n \hat{E}(t - n\tau)\exp(i\{2\pi v_C(t - n\tau) + n\Delta\varphi_{CE}\}).  \quad \text{Formula 1}$$

with the time t, an index n=0, 1, 2, 3, . . . and the inverse repetition frequency $$\tau = \frac{l_{RES}}{v_g}, \quad \text{Formula 2,}$$

where $l_{RES}$ represents the length of the laser resonator and where $v_g$ designates the group velocity of light in the resonator. $\phi_{CE}$ is the so-called carrier-envelope phase, i.e. the phase difference of the carrier wave between a characteristic point of time of the envelope (roughly the pulse maximum) and a characteristic point of time of the carrier wave (roughly a maximum of the positive half-wave). This phase difference is a consequence of the (usually not disappearing) difference between phase velocity $v_p$ and group velocity $v_g$ of light. For the progress of the carrier-envelope phase $\Delta\phi_{CE}$, it applies:

$$\Delta\varphi_{CE} = 2\pi\left(\frac{1}{v_g} - \frac{1}{v_p}\right)l_{RES} v_C  \quad \text{Formula 3}$$

where $v_C$=optical carrier frequency.

In the frequency image, the spectrum can be depicted by:

$$\tilde{E}(v) = \hat{\tilde{E}}(v - v_0)\sum_m \delta\left(v - \frac{\Delta\varphi_{CE}}{2\pi\tau} - \frac{m}{\tau}\right),  \quad \text{Formula 4}$$

i.e. by a (complex-valued) spectral envelope, given by the Fourier transformed of the temporal envelope, multiplied with a Dirca comb, i.e. a sum of equidistant Dirac delta functions. The spectral positions of the individual comb lines in the spectrum fulfill $$v_m = \frac{\Delta\varphi_{CE}}{2\pi\tau} + \frac{m}{\tau},  \quad \text{Formula 5}$$

which with the carrier-envelope-offset (CEO-) frequency $$v_{CEO} = \frac{\Delta\varphi_{CE}}{2\pi\tau}$$

and the definition of the repetition frequency $f_{REP}=1/\tau$ corresponds to $$v_m = v_{CEO} + m f_{REP}  \quad \text{Formula 6}$$

For explanation, it may be assumed that the parameters of the frequency comb are perfectly stabilized, i.e. that of those three variables characterizing it to (repetition frequency $f_{REP}$, optical carrier frequency $v_C$ and CEO frequency $v_{CEO}$) at least two could have been stabilized to the output signal of an atomic clock assumed as ideal. In case of the CEO frequency, the stabilization could also be effected to value 0, wherefore no atomic clock is then needed. A stabilization of this kind, however, is not mandatorily required as is outlined further below.

In a first step (i), this frequency comb is frequency-shifted in a well-defined manner. In a second step (ii), with the shifted frequency comb, the frequency and phase of the emission of a second source of phase-traceable radiation, here called working light source, is regulated so that its frequency can be tuned without hopping and continuously within the frequency comb.

Robustness of this phase control and the permitted frequency change velocity of the working light source can be increased by adjusting $v_{SL}$ through a frequency pre-stabilization roughly to a pre-value which should not lie farther away than a fracture (e.g. 25%) of the repetition frequency from the desired design value. This frequency presetting of the working light source can be achieved in various ways. The simplest method is the feed-forward approach, i.e. a control in which the regulating variable need not be exactly proportional to the reference variable. In pre-tests, a calibrating curve is generated and saved in a look-up table. This calibrating curve indicates which voltage at the frequency control input of the working light source leads to which working frequency.

Another possibility is a frequency control by means of an unrestricted interferometric frequency discriminator. For example, it is comprised of a heterodyne interferometer with a stable path length difference. The heterodyne interferometer is operated with the light of the working light source. Every frequency change of the working light source is converted by the frequency discriminator into a phase change of the electronic heterodyne beat signal. In other words: on predefining a reference variable in form of the phase shift between heterodyne driver and beat signal (this time not modulo-$2\pi$!) it is converted in a closed control loop into the controlled variable, i.e. into the carrier to frequency. There are several possibilities to realize unrestricted electronic phase shifters of this kind.

It should be noted that the phase control procedure described is absolutely unambiguous. Owing to the stable comb parameters assumed, there is exactly one correct phase setting modulo $2\pi$ for each pulse. This $2\pi$-ambiguity does not is come to bear, because owing to the frequency pre-stabilization the controlling difference of the phase control circuit with each pulse is already much smaller than 1 rad and further diminished by the control according to step (ii). Exploited herewith advantage is the so-called aliasing, a usually undesired effect on scanning periodical signals.

As has already been outlined, the phase setting in the phase actuator element can always remain less than $2\pi$ owing to the modulo $2\pi$ effect, even though the working frequency is shifted, for example, by $10^5$ comb line distances. Thereby, the required control voltage of the phase actuator element, for example an electro-optical modulator, remains relatively small. With typical waveguide modulators it may range under 10 volts. This enables a frequency/phase control even with highly repetitive ($f_{rep}$>10 MHz) systems.

The invention has the advantage in that the working frequency can be adjusted quickly and in a steady-phase manner to arbitrary values within the comb width, retraceable at any time to the basic unit of a second. And it is moreover advantageous that even complicated large-stroke modulation cycles are feasible. The number of carrier cycles (e.g. $10^{14}$) during the modulation cycle is always clearly known.

The invention is applicable in procedures and methods for selective status preparation in atoms/molecules with complicated term schemes. The invention is also applicable in LIDAR (light detection and ranging) methods. With such a procedure, a strictly time-linear frequency ramp of the optical field is converted by two-beam interference into a narrow-band HF field, whose frequency is proportional to the path and which can then be measured in principle with the accuracy of an atomic clock. Hence, the basic unit of a meter is realized here in conformity with the definition.

For generating working light, an active continuous light source is preferably used which generates a coherent-phase emission field. Special preference is given to an extended cavity laser diode (ECL, micro-resonator laser diode).

The tunable working light source may comprise a resonator which for example is connected to a temperature control so that it is adjustable in its resonance frequency by adjusting the temperature. Alternatively it is possible that the resonator comprises a piezo-mechanical adjustment device by means of which its length and thus the resonator frequency are adjustable.

Alternatively, the working light source may be comprised of a passive resonator whose storage time is substantially longer than the pulse distance (i.e. the resonance width is much smaller than the comb line distance). Phase coupling should then not be effected in quadrature as done with the phase control described hereinafter, but rather in phase. For example, this can be accomplished by means of the so-called Hänsch-Coulliaud method. In this manner, one can realize an optically passive coherent-phase light source whose tuning range free from mode hopping is greater than it is with all known light sources with coherent-phase emission fields (laser or optical-parametric oscillators, OPOs). The tuning range here is limited in principle only by the spectral reflection range of the resonator mirrors.

Preferably, the inventive method comprises the additional step of decoupling of light with the design frequency.

In accordance with a preferred embodiment, the changes in phase setting are executed at change points of time which have a temporal distance from each other amounting to maximally one inverse of the repetition frequency of the envelope.

Preferably, the phases of the possibly shifted frequency comb field and of the possibly shifted emission field of the working light source are coupled. On coupling, one or more additional predefinable heterodyne offset frequencies $v_{Het}$ can be considered.

Preferably, the working light source is so controlled that the light of the working light source and the light of the comb line by inclusion of the frequency shift have a solid phase relation. For example, an optical phase control can be utilized to this effect.

Preferably, the working frequency is so preset that its value differs by less than 25% of the repetition frequency from the design frequency.

Also inventive is a method as described hereinabove in which a value of the design frequency which varies in the course of time is predefined for the light. The time-dependence of this value is called frequency course. The frequency course is generated by varying the phase setting progresses $\Delta\phi_S$ in the course of time.

The phase actuator element may be an electro-optical modulator (EOM). Alternatively, it is also feasible to use an acousto-optical modulator (AOM). Preferably, the frequency synthesizer comprises a decoupling device for decoupling of light with the design frequency.

The phase actuator element is preferably set-up for time-discrete variation of the phase setting with a temporal distance of maximaly one inverse of the repetition frequency of the envelope. Such rapid variations in phase settings, as has been outlined hereinabove, cause a frequency shift, for example of the frequency comb or of the frequency of the working light source which is relevant for control.

A simple approach shows that it is irrelevant for the functioning of the invention whether the frequency comb is shifted in its frequency, whether the frequency of the working light is tuned by phase coupling and then lead out as exploitable output field or whether the frequency comb remains unchanged and the working light (with the opposite prefix) is frequency-shifted and then controlled upward by phase coupling to the frequency of a comb line. In this case, the working light as exploitable output field must be lead out prior to the frequency shift. In both cases, the frequency of the output field lead out corresponds to the predefined design frequency.

Preferably, the frequency comb light source is comprised of at least one frequency-stabilized oscillator, in particular a stabilized optical radiation source and/or a stabilized microwave radiation source. In this manner, the offset frequency (carrier envelope offset frequency) $v_{CEO}$ and/or the repetition frequency $f_{REP}$ are known with high accuracy so that also the value of the is working frequency can be adjusted with high accuracy to the target value.

Figure 2:
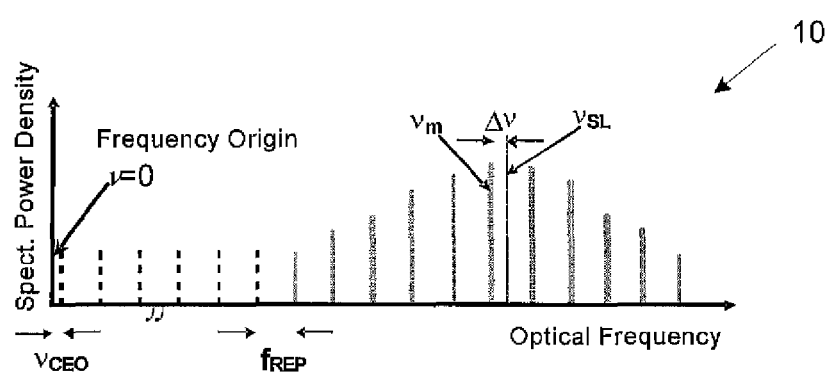
Figure 3A:
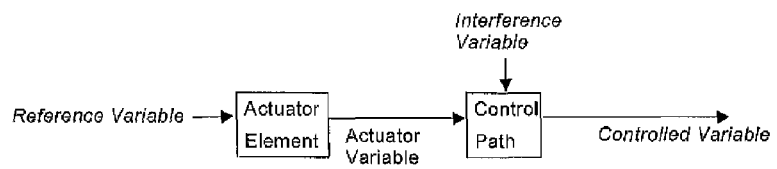
Figure 3B:
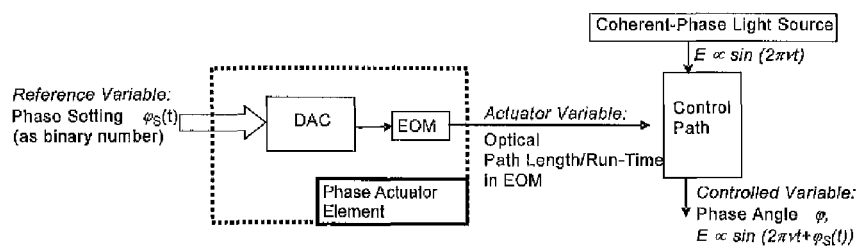
Figure 3C:
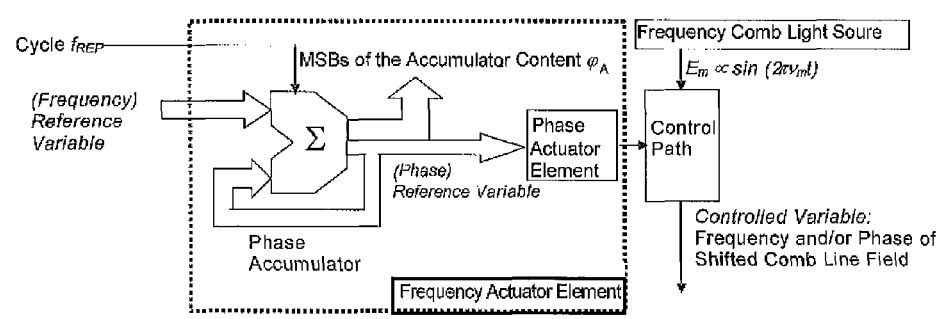
Figure 4A:
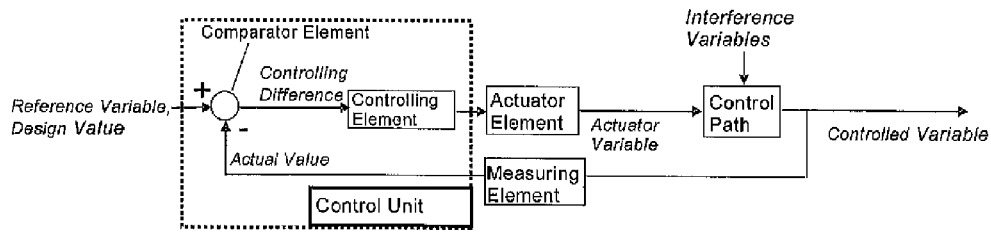
Figure 4B:
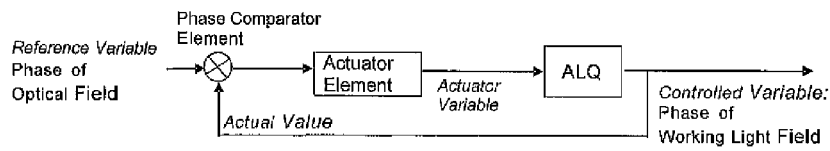
Figure 4C:
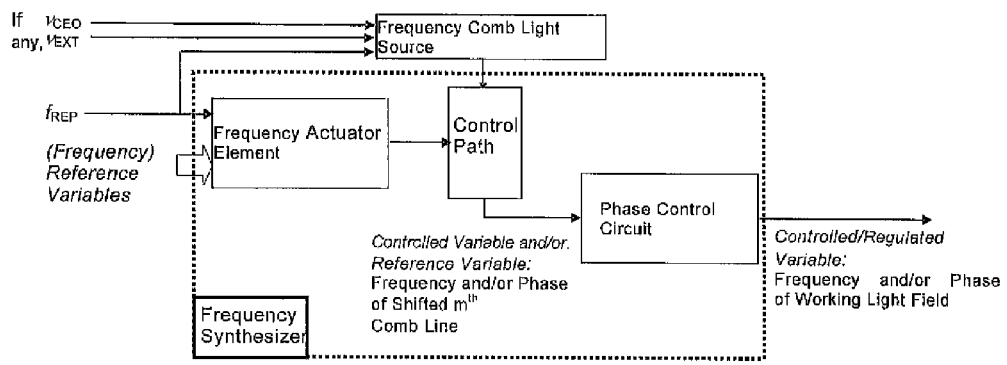
Figure 5A:
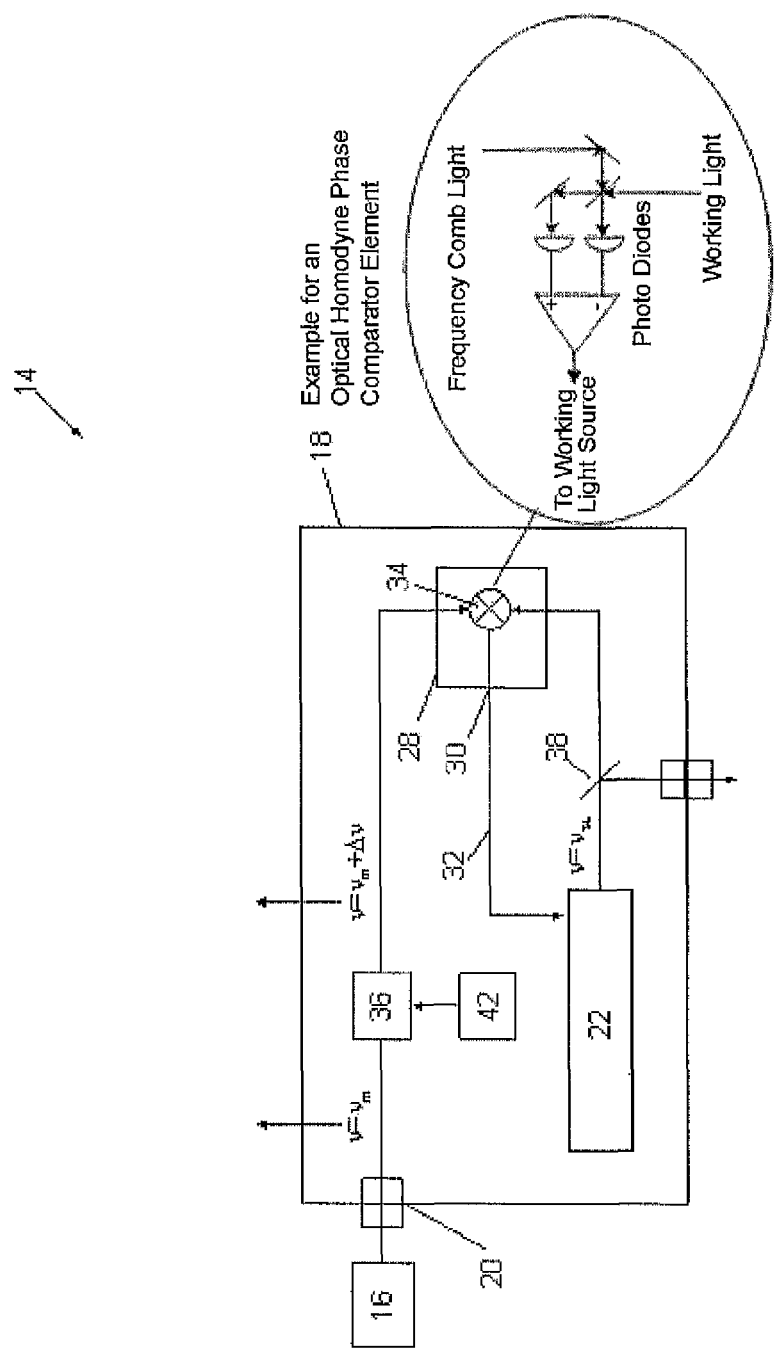
Figure 5B:
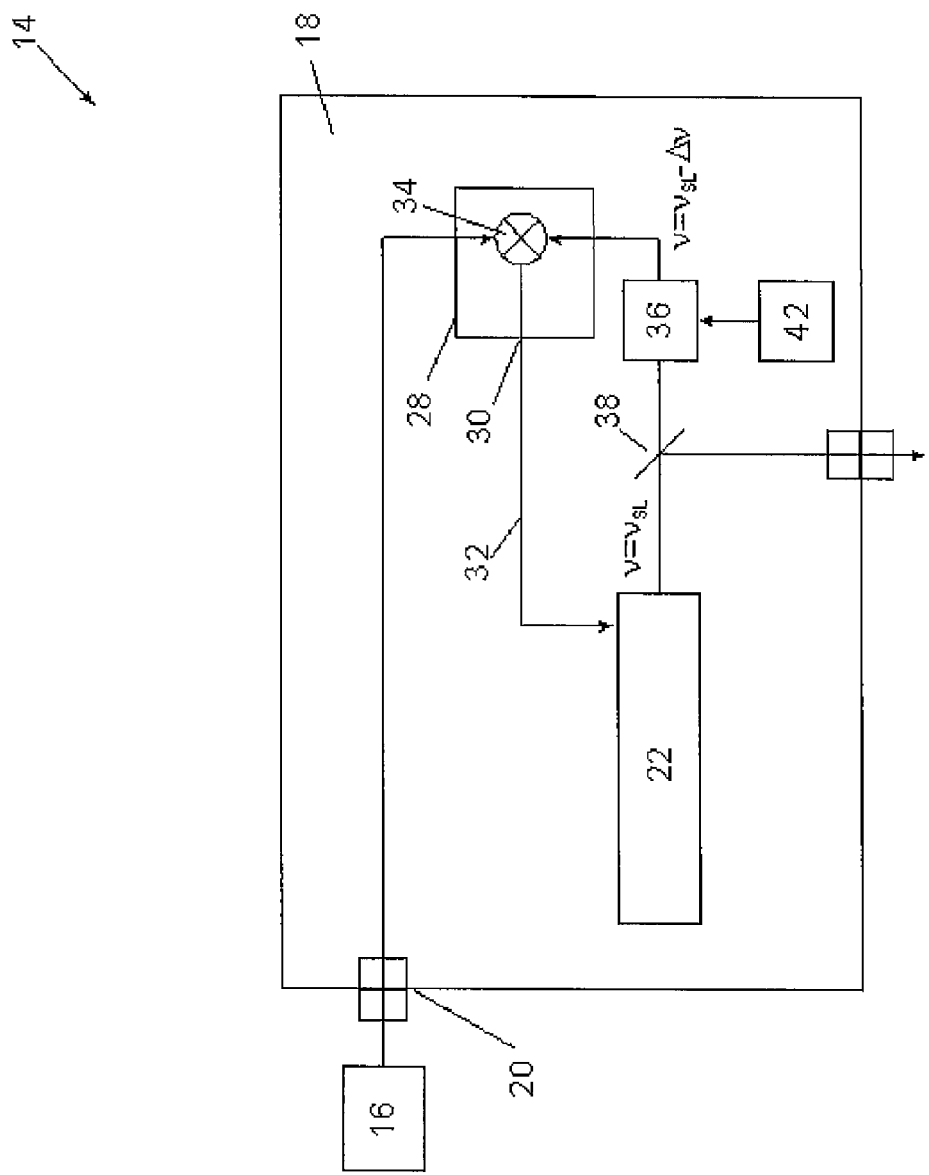
Figure 6:
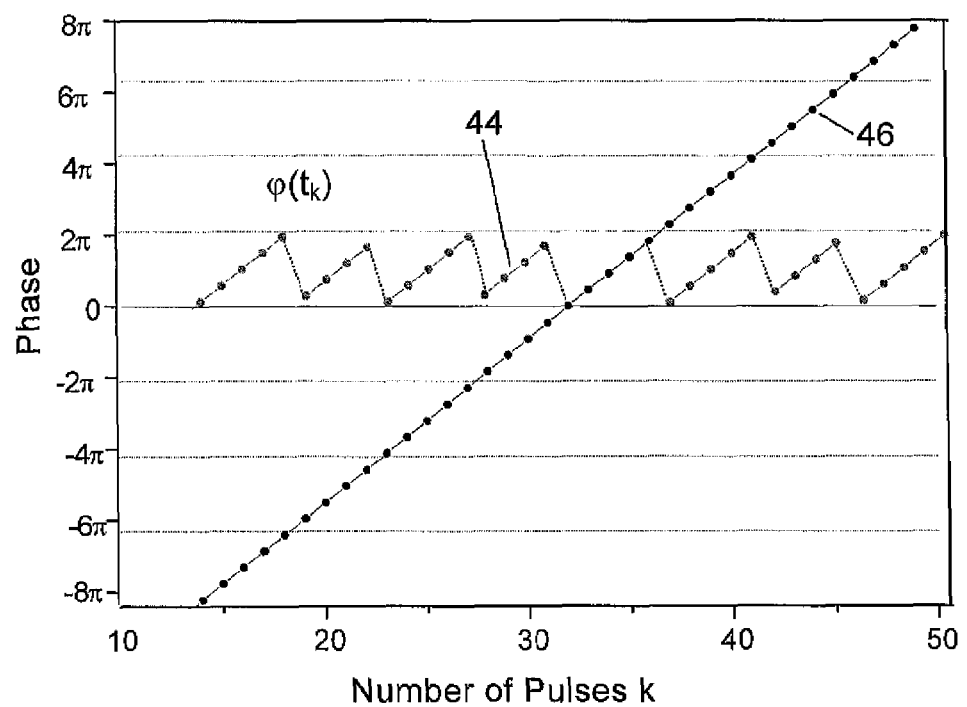
Figure 7:
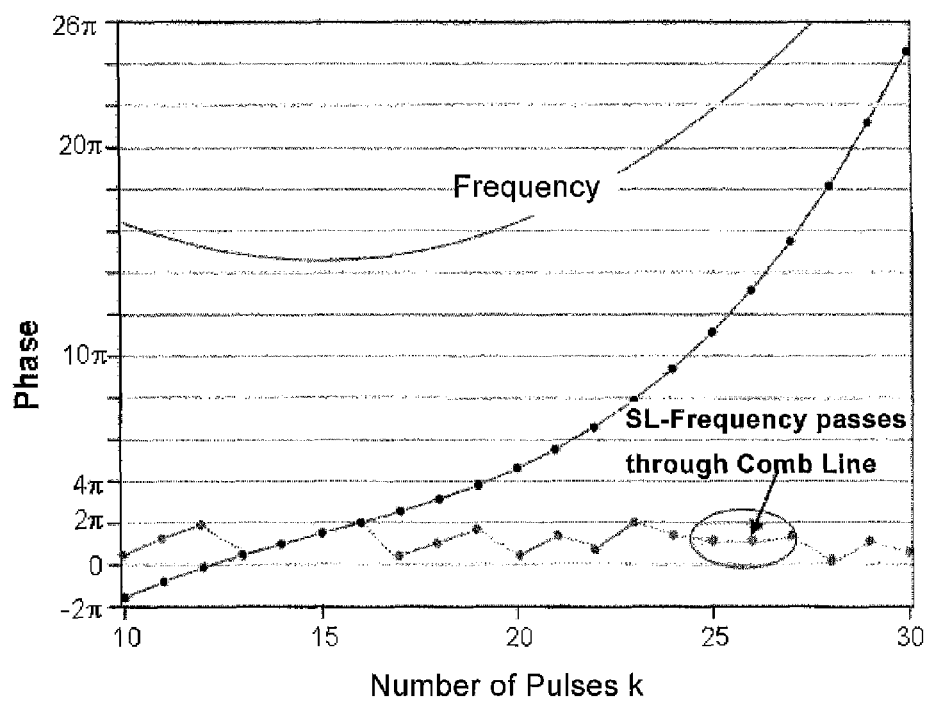

In the following, the invention is elucidated more closely based on exemplary practical examples with reference to the attached drawings, where FIG. 1 represents a schematic view of a frequency comb in a time image FIG. 2 shows the frequency comb according to FIG. 1 in a frequency image, FIG. 3a shows the simplified action plan of a control (according to DIN 19226), FIG. 3b shows the phase control of an optical field by means of a digital reference variable, FIG. 3c shows the rigid-phase frequency control of the spectral lines $E_m$ of a frequency comb by means of digital reference variables (wherein the phase actuator element drawn-in corresponds to FIG. 3b), FIG. 4a shows the simplified action plan of a control (according to DIN 19226), FIG. 4b shows the action plan of an optical homodyne phase control in snapped-in status, FIG. 4c shows a frequency generator comprising a frequency comb light source and an optical frequency synthesizer with rigid-phase frequency control as a combination of phase control according to FIG. 3b, frequency control according to FIG. 3c, and phase control according to FIG. 4b, FIG. 5a shows a schematic circuit diagram of an inventive frequency generator for implementing an inventive method, FIG. 5b shows a scheme of a second embodiment of an inventive optical frequency generator, FIG. 6 shows the chronology of the phase settings $\phi_S$ (44) generated by the phase actuator element which leads to a constant frequency shift (i.e. to a constant phase progress per time unit (curve 46)), and FIG. 7 gives an example for the temporal development of the phase setting $\phi_S$ of the phase actuator element 36 (curve between 0 and $2\pi$), which leads to the frequency tuning process (continuous line) of the working light as drawn-in here.

FIG. 1 schematically shows a frequency comb 10 in an image of time, it means the electrical field strength E is plotted over the time t. A frequency comb 10 of this kind can be obtained, for example, by means of a Kerr lens mode-coupled titanium-doped sapphire laser. The frequency comb 10 can be described by modulation of the carrier oscillation with the carrier frequency $v_C$ by a generally complex-valued envelope 12 with a repetition frequency $f_{REP}$. Here, a purely real envelope (amplitude modulation in form of short pulses) has been assumed in exemplary manner.

FIG. 2 shows the frequency comb 10 in the frequency image, wherein the power density of the relevant spectral portion is plotted over the optical frequency $v$. The bell-curve-shaped curve in exemplary manner describes the spectral envelope of the comb-shaped emission spectrum. Located at the left end of the bell curve is the long-wave spectral range, whereas the short-wave range is shown at the right end. With a strictly time-periodical modulation as assumed in FIG. 1, the individual spectral lines are equidistant and have a distance from each other that corresponds to the repetition frequency $f_{REP}$. The frequency comb has been extrapolated to the frequency origin (dashed lines). Commencing with the (fictitious) first comb line with positive frequency (CEO frequency), an integer ordinal number m is allocated to each comb line.

The phase and/or frequency control for frequency shift of comb lines is explained in FIG. 3. The terms used are introduced in FIG. 3a. FIG. 3b shows one embodiment of an optical phase control, wherein the (phase-) reference variable [phase setting $\phi_S(t)$] is available in digital form, i.e. in form of a binary number. This binary number is converted into an (analogous) electrical voltage which influences the refraction index of an electro-optical modulator and thus, acting as a controlling variable [run-time and/or path length variation] varies the phase of a light field that stems from a coherent-phase light source. Now, if as shown in FIG. 3c a frequency comb light source is implemented and the value of this (phase-)reference variable is varied in the cycle of the repetition frequency $\tau=1/f_{REP}$ by $\Delta\phi_S(t)$, then the frequency of each comb line is varied by the value $$\Delta v = \frac{\Delta\varphi_S(t)}{2\pi\tau}, \quad \tau = \frac{1}{f_{REP}}$$

Hence the following formula is applicable:

$$E_m \propto \sin\left(2\pi v_m t + \frac{\Delta\varphi_S(t)}{\tau}t\right)$$

This variation of the (phase-) reference variable of the phase control according to FIG. 3b can be accomplished, for example, as shown in FIG. 3c, by the aid of a so-called phase accumulator. Here, after each time interval $\tau$, a binary number, namely the binary value $\Delta\phi_S$ is added to the actual contents of the phase accumulator (whose value is designated here with $\phi_A$). The low-order bits of the accumulator output are utilized as (phase-) reference variable of the phase control according to FIG. 3b. Its number must be large enough to cover an angular interval of the width $2\pi$. The low-order bits together with the higher-order bits (MSBs), with the phase control engaged, show the actual phase difference between the working light field and the field of the (non-shifted) $m^{th}$ comb line, provided that the accumulator contents $\phi_A$ has been set to the value 0 at the beginning of the tuning procedure.

FIG. 3c thus shows a frequency control in which the reference variable $$2\pi\Delta v(t) = \frac{\Delta\varphi_S(t)}{\tau}$$

after the control path is mapped onto the (rigid-phase) controlled variable [phase of the field of the shifted $m^{th}$ comb line]

$$2\pi t(v_m + \Delta v) = 2\pi t\left(v_m + \frac{\Delta\varphi_S(t)}{2\pi\tau}\right).$$

It serves as reference variable for the phase control of the working light frequency as shown in FIG. 4b.

For elucidation, FIG. 4a presents the basic scheme of a simple control and introduces the corresponding DIN terms. Simply put, the design value of the reference variable is compared with the actual value of the controlled variable by means of a comparator element. The resultant variable, i.e. the control difference, is suitably processed and acts as controlling variable by means of the control path on the controlled variable.

In the case contemplated here of an optical phase control circuit, the phase values of the output fields of the two light sources, namely the emission of the frequency comb light source and the light of the working light source are compared with each other by the aid of a phase comparator element, see FIG. 4b. As stated before, the phase of the field of the frequency-shifted $m^{th}$ comb line serves as reference variable and the phase of the working light field is the controlled variable.

This comparison is feasible whenever the two light fields exist simultaneously and interfere with each other, that means if there is a spatial, spectral, temporal, and polarization overlap of the fields.

By feedback of the controlling variable to the control path, the controlled variable, i.e. the phase of the working light field $2\pi v_{SL}t$, is controlled to the reference variable [phase of the field of the frequency-shifted $m^{th}$ comb line].

For the sake of completeness, it should be noted that here, too, a heterodyne scheme could be implemented in which the phase of the (electronic) beat signal between the frequency comb (after it has been frequency-shifted with the frequency control according to FIG. 3c) and the working light source AQL is is controlled upward to a high-frequency reference signal having a heterodyne frequency $v_{Het}\neq 0$. Advantageous here is the insensitivity versus scattered light, the possibility for an automated transition from frequency to phase control and for pre-scaling of the beat frequency (wide-angle phase-locking) in the interest of an enhanced dynamic range.

The combination of the rigid-phase control according to FIG. 3c and the optical phase control according to FIG. 4b results in an optical frequency synthesizer 18, which together with the frequency comb light source 16 forms the inventive frequency generator.

By analogy with a radio frequency synthesizer, the optical frequency synthesizer 18 is equipped with an (e.g. digital) input for the design value of the output frequency and an input for the reference frequency (frequencies). As outlined further below, this can be two of the variables $f_{REP}$, $\nu_{EXT}$ and/or $\nu_{CEO}$.

FIG. 5a shows an inventive frequency generator 14, which comprises a frequency comb light source 16 and an inventive frequency synthesizer 18 whose components are surrounded by a dashed rectangular. The frequency comb light source 16, for example, is comprised of a femtosecond laser whose emission parameters can be stipulated to a solid and known relation to the frequency of an optical atomic clock not drawn-in. The frequency generator 14 is connected to a light input 20 of the frequency synthesizer 18 so that the light field 10 of the frequency comb light source 16 can be fed.

The frequency synthesizer 18 comprises a working light source 22, for example in form of a laser diode with external resonator, wherein the resonator is variable in its resonator frequency. The working light source 22 emits working light 24 with a working frequency $\nu_{SL}$. The working light is conducted to an input of a control unit 28. The control unit is equipped with two inputs for light fields and it comprises a phase comparator element 34 which compares the phases of the is input fields and issues a control difference 30. By means of a signal transmission device 32, this control difference (after a suitable signal processing in a control element) is issued to the working light source 22 for setting the working frequency.

Sent to the second input of the control unit 28 is the field from the frequency comb light source which has passed through the phase actuator element 36. To this effect, the phase actuator element 36 is connected with the light input 20.

A simple example for an optical phase comparator element 34 using the so-called homodyne scheme is also illustrated in FIG. 5a. Here, both optical fields are superimposed with a 50:50 mirror, and the superimposed fields at its two outputs are detected with two photo diodes. Subsequently, the difference of their photo currents is formed. This electrical control difference has its zero crossing exactly at the moment when the phases of the two optical fields are in quadrature during their superimposition. The control difference is (in case of a small signal) proportional to the deviation from this quadrature position. By feedback to the control path (e.g. by influencing the controlling variable [resonator length of the working light source 22] by means of a piezo-adjuster), the controlled variable is fed forward to the reference variable.

The phase actuator element 36, for example, is an electro-optical modulator or an acousto-optical modulator, for example an integrated waveguide EOM.

In operation, the following procedure is executed. By the aid of the working light source 22, the working light is generated. Via the light input 20, the frequency comb 10 is coupled into the frequency synthesizer 18. The frequency comb is then shifted by means of the phase actuator element 36, for example at equidistant points of time $t_k$ with k=1, 2, 3, ... by discrete phase settings $\phi_S(t_k)$. Since the changes in the values of the phase setting follow rapidly in succession, this phase setting progress (measured downstream of the phase to actuator element) corresponds to a change of the offset frequency and/or carrier envelope offset frequency $\nu_{CEO}$, as has been described hereinabove. For example, if the $m^{th}$ comb line (frequency $\nu_m$) is contemplated, it is shifted by means of the regular discrete phase progresses by the frequency shift $\Delta\nu$. The working light source 22 is then driven by the control unit 28 in such a manner that the working frequency $\nu_{SL}$ (in the snapped-in status of the phase control) becomes equivalent to the frequency-shifted comb line frequency $\nu_{Soll}=\nu_m+\Delta\nu$.

In order to control the frequency of the working light source to its design value $\nu_{Soll}$, as schematically drawn in FIG. 5a, the nearest comb line is determined at first, in the case contemplated with the ordinary number m. Subsequently, the phase actuator element 36 is so driven by a schematically drawn check-up device 42, which includes the phase-rigid frequency control according to FIG. 3c, that the frequency of the $m^{th}$ comb line, measured downstream of the phase actuator element 36 (i.e. the controlled variable of the frequency control) has exactly the value $\nu_{Soll}=\nu_m+\Delta\nu$. Subsequently, the check-up device 42 guides the frequency of the working light source so tightly to the value $\nu_{Soll}$ that as a consequence of the phase control the phase of the working light snaps in this reference variable and the working light source 22 oscillates exactly at the design frequency $\nu_{Soll}$.

Part of the working light field whose frequency value then corresponds to the design frequency value can be decoupled via a beam splitter 38 from the frequency synthesizer 18.

Now if the design frequency $\nu_{Soll}(t)$ is to become time-dependent, then the control unit 42 drives the phase actuator element 36 in such a manner that the controlled variable [frequency of the shifted comb line] assumes the predefined time-dependent value $\nu_{Soll}(t)$. If the value of the frequency shift $\Delta\nu$ is greater than the value of the repetition frequency $f_{REP}$ (this happens if the emission line of the working light source moves over a comb line), no phase setting progresses greater than $2\pi$ are needed nevertheless, as has been outlined hereinabove.

FIG. 5b shows an alternative embodiment of an inventive frequency generator 14, in which the phase actuator element 36 is utilized for external shifting of the working frequency $\nu_{SL}$ of the working light source 22. Hence, it is the frequency and/or phase of the $m^{th}$ comb line which is the reference variable here for the phase control of the working light field whose frequency value has been shifted by a rigid-phase frequency control according to FIG. 3c with inverse prefix.

The working light is decoupled upstream to the control path by means of the decoupling device 38. By analogy with FIG. 5a, the changes in phase settings $\phi_S$ are also effected within a temporal distance $\tau$.

The embodiments according to FIGS. 5a and 5b can be combined.

For special applications, the roles of the comb line field and working light can also be reversed. Then the carrier frequency of the frequency comb is de-tuned in relation to the "working light" frequency. In principle, this can be carried-out indefinitely, e.g. via frequency intervals whose width amounts to a multiple of $f_{REP}$. The CE phase in this case is controlled to the field of the "working light source" (which is an optical frequency normal here, for example) that has passed through the frequency control path described hereinabove.

FIG. 6 shows a curve 44 as an example which indicates the phase settings $\phi(t_k)$ which are set by the phase actuator element 36 at the discrete points of time $t_k$ in order to generate a constant frequency shift $\Delta\nu$. Moreover, it shows a second curve 46, the time development of the working light phase relative to a (imaginary) continuous line light field having the frequency $\nu_M$.

FIG. 7 shows the corresponding curves as examples for a time-dependence of the design frequency in form of a parabola.

Active Frequency Transfer to Stabilize Selected Comb Lines

At the beginning of these reflections, an ideal stable frequency comb has been assumed. However, this is not necessary if applying the so-called transfer concept [H. R. Telle, B. Upphardt, J. Stenger, "Kerr-lens, mode-locked lasers as transfer oscillators for optical frequency measurements", Appl. Phys. B 74, 1-6 (2002)]. Here, 2 of the afore-mentioned 3 comb parameters are continually measured, for example the optical carrier frequency and the repetition rate. These measuring values are considered in computing the phase settings of the individual pulses.

The following reflections relate to freely selected comb lines, which however are then assumed with a fixed ordinary number (running index). This situation occurs in optical frequency metrology. Three situations are contemplated in the following which are based on various reference signal configurations:

1) Method A, Based on an Optical Beat of and $v_{CEO}$

A stable optical reference field having the frequency $v_{EXT}$ is assumed to exist. The reference field is superimposed with the field of the frequency comb. By means of a photo diode, the beat with the nearest comb line is measured.

The assumption taken for the following description of the signal processing schemes is the comb equation $v_m = mf_{REP} + v_{CEO}$ (Formula 6). For avoidance of double indices (which would occur with several ordinary numbers m), their notation is simplified as follows:

$$v_X \equiv m_X f_{REP} + v_{CEO} \quad \text{Formula 7}$$

Then you obtain $$v_S = v_{EXT} - v_1 \quad \text{Formula 8}$$
$$= v_{EXT} - m_1 f_{REP} - v_{CEO}$$

as beat frequency. The carrier-envelope-offset-frequency $v_{CEO}$ is simultaneously measured, e.g. with a so-called f-2f-interferometer.

By analogous mixing of $v_S$ and $v_{CEO}$ its sum frequency is generated. It serves as cycle signal for a DDS-IC (direct digital synthesis integrated circuit), whose tuning word is so chosen that it realizes a rational division ratio $m_2/m_1$, wherein $m_2$ represents the ordinary number of the comb line to be stabilized. Subtracted from this signal by means of analogous mixing is $v_{CEO}$ in order to obtain the frequency $v_{CONTROL}$ of the correction signal.

$$v_{CONTROL} \equiv \frac{m_2}{m_1}(v_S + v_{CEO}) - v_{CEO} \quad \text{Formula 9}$$
$$= \frac{m_2}{m_1} v_{EXT} - m_2 f_{REP} - v_{CEO}$$

By addition of this microwave frequency to the frequency $v_2$ of the $m_2$-$^{th}$ comb line, e.g. by frequency shift by means of an acousto-optical modulator, you obtain $$v_2 + v_{control} \equiv \frac{m_2}{m_1} v_{EXT} \quad \text{Formula 10}$$

and thus a reference variable for the subsequent phase control of the working light which no longer depends on the parameters $v_X$, $v_{CEO}$, $f_{REP}$ of the frequency comb.

2) Method B, Based on the Measurement of $f_{REP}$ and $v_{CEO}$

Let us assume the existence of a stable-frequency microwave reference signal, e.g. $f_{MW} \approx 10$ GHz. The beat is formed with the corresponding harmonic of the repetition frequency. Its frequency is assumed to be $$f_0 = f_{MW} - m_M f_{REP} \approx 10 \text{ MHz}. \quad \text{Formula 11}$$

The microwave frequency is digitally divided and $f_0$ is digitally high-multiplied. For sake of simplicity, n=32 is assumed to apply to factor n and/or divisor 1/n. The difference of the frequencies thus obtained $$f_1 = nf_0 - f_{MW}/n \approx 10 \text{ MHz} \quad \text{Formula 12}$$

again roughly lies at 10 MHz. This procedure is still repeated twice.

$$f_2 = nf_1 - f_{MW}/n \approx 10 \text{ MHz} \quad \text{Formula 13}$$

and $$f_3 = nf_2 - f_{MW}/n \approx 10 \text{ MHz}. \quad \text{Formula 14}$$

If the frequency is defined as $$f_{EXT} \equiv f_3 + n^3 m_{MW} f_{REP} \quad \text{Formula 15}$$
$$= (n^3 - n - 1 - 1/n) f_{MW},$$

then it lies in the optical spectral range, it means $f_{MW}$ has been fictitiously multiplied up into the optical spectral range and f is the beat frequency between the virtual frequency $f_{EXT}$ and the comb line of a fictitious, $v_{CEO}$-free comb having the ordinary number $n^3 \, m_{MW}$:

$$f_3 = f_{EXT} - n^3 m_{MW} f_{REF}. \quad \text{Formula 16}$$

By means of a DDS-IC (direct digital (frequency) synthesis integrated circuit), this frequency is projected to the selected comb line with the ordinary number $m_X$ and $v_{CEO}$ is added by mixing as described hereinabove. Thus you obtain a correction signal having the frequency $$v_{control} = \frac{m_X}{n^3 m_{MW}} f_3 + v_{CEO} \quad \text{Formula 17}$$

By analogy with formula 10, the following is obtained by frequency shift for the $m_X$-$^{th}$ comb line $$v_X - v_{CONTROL} = \quad \text{Formula 18}$$
$$\frac{m_X}{n^3 m_{MW}} f_{EXT} = \frac{m_X}{n^3 m_{MW}} (n^3 - n - 1 - 1/n) f_{MW}.$$

The frequency of this comb line (frequency-shifted by the value $v_{CONTROL}$) thus corresponds to a non-integer multiple of the microwave reference frequency and, as stated hereinabove, it becomes independent of the parameters of the frequency comb.

3) Method C, Based on the Measurement of an Optical Beat Signal and $f_{REP}$

This scheme is less advantageous, because it requires both an optical and a microwave reference frequency. Based on the formula 16, the following is obtained for the correction signal having the frequency $$v_{CONTROL} \equiv \Delta v - \frac{m_2 - m_1}{n^3 m_{MW}} f_3 \quad \text{Formula 19}$$

$$= v_{EXT} - m_2 f_{REP} - v_{CEO} - \frac{m_2 - m_1}{n^3 m_{MW}} f_{EXT}$$

and the frequency of the $m_2$-$^{th}$ comb line is shifted to $$v_2 + v_{CONTROL} = v_{EXT} - \frac{m_2 - m_1}{n^3 m_{MW}} f_{EXT} \quad \text{Formula 20}$$

and thus it again becomes independent of the frequency comb parameters.

Execution of the Phase/Frequency Control

As stated hereinabove, the required phase setting at the EOM remains preferably smaller than $2\pi$. A constant frequency shift, i.e. a time-linear ramp of the phase setting would thus be divided in form of a saw-tooth into numerous small ramps. Suitable for simply realizing such modulo-$2\pi$ ramps are NCO—(numerically controlled oscillator)—ICs. The NCO is a digital part of a DDS—(direct digital synthesis)—IC. Most of the modern designs, so-called complete DDS, combine the digital and analogous part in a casing, and only the analogous curve shape (mostly sine/cosine) is provided at the output. However, there are some mostly older ICs of this kind, wherein the highest bits of their phase accumulator are conducted outwardly. This is the case, for example, with the IC Q2240I-3S1 from the company Qualcomm. This component comprises a tuning-word width of 32 bit and a maximal cycle frequency of 100 MHz (with 5 V supply voltage). The 31 bit broad utilizable tuning-word (TW) here is read-in in parallel, setting the bit 32 (the MSB) to 0 in terms of hardware so as to fulfil the Nyquist condition. The upper 14 bit of the phase accumulator are existing in parallel (alternatively to the contents of the internal sine-look-up table) at the output.

Hereof, in principle, the 13 lower-order bits can be utilized for driving a DAC (digital-to-analog-converter). (The highest bit cannot be set by the TW, as has been outlined hereinabove.) In practice it is certainly sufficient to utilize only the upper 8 bits thereof. This leads to a phase resolution of 25 mrad, which in most cases should be more than sufficient A value of 6 Bit and/or 0.1 rad would also still be acceptable for numerous applications. Now the transmission rate between DAC and EOM is so adjusted that the 8 bit, i.e. the binary number range between 0000 0000 and 1111 1111 at the DAC input correspond to a phase shift of $2\pi$, and the IC is cycled with the repetition frequency. Then the a.m. modulo-$2\pi$ phase progress is automatically fulfilled. The TW of the NCO then determines (in binary units) the optical frequency offset of SL from a comb line (always measured with the same prefix, e.g. relatively to a low-frequency line). A value of
TW1=0000 0000 0000 0000 0000 0000
means for instance that the SL frequency exactly corresponds with one line of the non-shifted frequency comb, and
TW2=0100 0000 0000 0000 0000 0000
leads to a frequency exactly in the middle between two comb lines. With
TW3=0111 1111 1111 1111 1111 1111
the next comb line is almost reached, and after enhancement by one LSB, the next line is reached exactly at
TW4=(1)000 0000 0000 0000 0000 0000.

Now the phase setting progress constantly amounts to $2\pi$, i.e. the DAC-input is word remains constant. As stated above, the MSB in terms of hardware is set to 0, i.e. (1) is replaced with a 0. Thus, TW$_4$ is identical to TW$_1$.

FIG. 6 elucidates the situation by the example of a solid frequency shift, i.e. with a time-linear phase progress. Owing to the so-called overflow in the NCO-accumulator, an irregular saw-tooth signal is obtained at the DAC output, which, for example, is quantized with 6 or 8 bit resolution.

For frequency variation, the TW is set by a control unit (e.g. a computer), wherein the phase setting progresses $\Delta\phi_S$, i.e. the leaps between two consecutive values, should be noticeably smaller than 1 rad in order to ensure a safe and secure phase follow-up by the PLL. For example, for $\Delta\phi_S$<0.1 rad the differences $\Delta$ of the binary numbers must not be greater than $\Delta(0.1\text{rad})$=0000 0010 0000 0000 0000 0000.

FIG. 7 shows an example for a tuning process. Here, the frequency was changed in terms of time in form of a parabola so that the value of the phase setting follows a cubic parabola. The DAC output voltage is completely irregular now. Roughly at pulse no. 27, the frequency of a line of the non-shifted frequency comb is passed through, and here the phase setting progress between two pulses amounts to $2\pi$. Maybe it is remarkable that this comb line passage need to not occur exactly at the moment of a pulse.

The frequency resolution of the optical synthesizer is given by the LSB of TW. In accordance with the a.m. evaluation of the phase accumulator, exactly $2^{31}$ dock cycles are needed for one phase setting progress of $2\pi$. With a repetition frequency of for example $f_{REP}$=100 MHz, this results in a frequency resolution of around $\Delta v$=5 mHz, all this at an optical carrier frequency of e.g. $v$=200 THz. Hence the relative frequency resolution amounts to $$\Delta v/v \approx 2*10^{-16} \text{ or roughly 52 bit !}$$

For frequency tuning ability, a value of one comb line distance within a time interval of 8 pulses seems to be the realistic upper velocity limit, which corresponds to a detuning velocity of $$\Delta v/\Delta t \approx 1 \text{ THz/s.}$$

In view of the fact that with the presented synthesis concept the momentary phase value is absolutely known (i.e. not modulo-$2\pi$, but including the period number from the starting moment on), these values are not achievable with prior art methods.

Passive Working Light Source with Intra-Cavity Frequency Doubling (Second-Harmonic-Generation, SHG)

Described hereinabove has been the possibility of generating a coherent-phase continuous line signal optically passively with a tunable empty resonator alternatively to an active working light source. Expressed in the frequency image, the entire frequency comb would always be shifted by means of the rigid-phase frequency control as described before in such a manner that the frequency of one of its lines matches the medium frequency of one of the resonator longitudinal modes and thus incite the corresponding oscillation in correct-phase manner. The disadvantage lies in low efficiency; only a single comb line of the possibly $10^5$ or $10^6$ comb lines is utilized.

This is improvable by resonator-internal frequency doubling/sum frequency generation by means of an optical-nonlinear crystal with resonance on the second harmonic. Apart from the second harmonic of a certain comb line, it is is now possible for the sum frequency signals of all comb pairs symmetrically arranged hereto to contribute to the overall signal, and the overall efficiency increases substantially. There are far-reaching parallels to the 2-photon frequency spectroscopy.

For phase coupling of the internal frequency-doubles field at the excitation field by longitudinal control of the resonator, one could apply a phase comparison similar to the Hänsch-Couillaud method: the portion of the fundamental wave transmitted through the resonator is turned by 90° in its polarization by an (achromatic) λ/2 plate and sent to a second resonator-external doubler crystal. Since the SH light emitted in parallel from the resonator is not turned in its polarization (here the lambda/2 plate is a λ plate!), the polarization directions of both SH signals stand vertically to each other and their relative phase is easy to determine in terms of polarization in order to readjust the length of the resonator. On the basis of an Er- or Yb-fiber laser-based frequency comb, a broadband-tunable continuous-line light source in the vis/near-IR range is thus obtained in which—as outlined hereinabove—the momentary phase value is absolutely known.

LIST OF REFERENCE SIGNS

10 Frequency comb
12 Envelope
16 Frequency comb light source
18 Frequency synthesizer
20 Light input
22 Working light source ALQ
24 Working light
28 Controlling unit
30 Controlling difference
32 Signal transmission device
34 Phase comparator element
36 Phase actuator element
38 Decoupling device
40 Light field
42 Control device
44 Curve
46 Curve
ν Optical frequency
$\lambda_C$ Carrier frequency
$\nu_{CEO}$ Carrier envelope offset frequency
$\nu_{SL}$ Working frequency
$\nu_{Soll}$ Design value of working frequency
$\nu_{SL}$ Frequency offset with heterodyne-phase control
$\nu_S$ Beat frequency
$\Delta\nu$ Frequency shift
$\phi_S$ Phase setting
$\Delta\phi_S$ Phase setting progress
$\phi_A$ Value of phase accumulator contents
$\phi_{CE}$ Carrier-envelope frequency
$\Delta\phi_{CE}$ Progress of carrier envelope frequency
E Electrical field
f Modulation frequency, e.g. microwave frequency
$f_{REP}$ Repetition frequency
$l_{RES}$ Length of resonator
m Index of comb lines
n Index of pulses/modulation events
t Time
τ Repetition time
$v_g$ Group velocity
$v_p$ Phase velocity

The invention claimed is:

1. Method for generating coherent-phase light having a predefinable frequency value ($\nu_{Soll}$), comprising the steps of
   (a) generating working light with a working frequency ($\nu_{SL}$),
   (b) generating a frequency comb (10), which is a light field that consists of equidistant coherent-phase spectral lines,
   (c) selecting a comb line (having the index m) from the frequency comb (10) having a frequency ($\nu_m$),
   (d) generating a frequency shift ($\Delta\nu$) of the frequency comb (10) and/or the working frequency ($\nu_{SL}$) by means of time-dependent phase settings ($\phi_S(t)$) modulo a multiple of 2π, in particular of 2π, and
   (e) phase-coupling the possibly frequency-shifted fields of the working light ($\nu_{SL}$) and the one possibly frequency-shifted frequency comb line ($\nu_m$), so that the frequencies thereof are rigidly phase-coupled via the frequency shift ($\Delta\nu$), and working light having the desired frequency ($\nu_{Soll}$) is obtained.

2. Method according to claim 1, wherein the changes in phase setting ($\phi_S(t)$) are carried-out at points of time ($t_k$) that have a temporal distance from each other of maximally one inverse (τ) of the comb line distance ($f_{REP}$).

3. Method according to claim 1, wherein the frequencies and/or phase of the light field of the working light source and/or frequency comb is so controlled that
   the light field (24) of the working light source (22) and
   the light field of the $m^{th}$ comb line ($\nu_m$) including the frequency shift ($\Delta\nu$) have a well-defined phase relation to each other.

4. Method according to claim 1, wherein the working frequency ($\nu_{SL}$) is so pre-set that it is by less than 25% of the value of the repetition frequency ($f_{REP}$) away from the design frequency ($\nu_{Soll}$).

5. Method according to claim 1 for generating light with a value of the design frequency ($\nu_{Soll}(t)$) varying in the course of time in accordance with a predefined frequency course, wherein the value ($\Delta\nu(t)$) of the frequency shift is varied in the course of time by varying the progress of the phase setting ($\phi_S(t_k)$) in the course of time.

6. Optical frequency synthesizer comprised of
   (i) a tunable working light source (22) for emitting working light (24) with a working frequency ($\nu_{SL}$),
   (ii) a light input (20) for coupling-in a frequency comb (10), which is a light field that consists of equidistant coherent-phase spectral lines, and
   (iii) a phase actuator element (36), which is set up for generating a frequency shift ($\Delta\nu$) of the frequency comb (10) and/or working frequency ($\nu_{SL}$) by varying its phase setting ($\phi_S(t_k)$) modulo a multiple of 2π, in particular of 2π,
   so that by means of changes in the phase setting ($\phi_S(t_k)$) carried-out at periodically repeated points of time a line of the frequency comb (10) having a frequency ($\nu_m$) can be shifted to a predefined design frequency ($\nu_{Soll}$).

7. Optical frequency synthesizer according to claim 6, further comprising
   (iv) a control (28) for controlling the frequency and/or phase of the light field of the working light source (22) and/or a line ($\nu_m$) of the frequency comb (10), so that an amount ($|\nu_{SL}-\nu_m\pm\Delta\nu|$) of a differential frequency between the working frequency staggered by $\Delta\nu$ and the comb line frequency and/or of the working frequency and the comb line frequency staggered by $\Delta\nu$ becomes identical to a predefinable heterodyne frequency value ($\nu_{Het}$), which in particular may assume the value 0.

8. Optical frequency synthesizer according to claim 6, wherein the working light source (22) comprises a diode laser, in particular a laser diode with external resonator.

9. Optical frequency synthesizer according to claim 6, wherein the working light source (22) comprises a passive optical resonator that can generate a coherent-phase working light field from an irradiated coherent-phase or non-coherent-phase light field.

10. Optical frequency synthesizer according to claim 9, wherein a coherent-phase light field having the working frequency ($v_{SL}$) can be efficiently generated by means of a non-linear optical element within the resonator from light fields coupled into the passive resonator, the sum frequency of which corresponds to the resonance frequency ($v_{SL}$) of the resonator.

11. Optical frequency generator comprised of
  an optical frequency synthesizer (18) according to claim 6, and
  a frequency comb light source (16) for generating the frequency comb (10), which is describable as having been obtained by modulation of a carrier vibration with a carrier frequency ($v_C$) by a complex-valued modulation function (14) with a repetition frequency ($f_{REP}$).

* * * * *